(12) United States Patent
Tao et al.

(10) Patent No.: US 11,774,776 B2
(45) Date of Patent: Oct. 3, 2023

(54) GRATING SUBSTRATE, DISPLAY SUBSTRATE, DISPLAY DEVICE AND DISPLAY METHOD THEREOF

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Wenchang Tao, Beijing (CN); Zongxiang Li, Beijing (CN); Linlin Lin, Beijing (CN); Xinmao Qiu, Beijing (CN); Zuwen Liu, Beijing (CN); Jin Wang, Beijing (CN); Changhong Shi, Beijing (CN); Yaochao Lv, Beijing (CN); Jiamin Liao, Beijing (CN); Yao Liu, Beijing (CN); Xi Chen, Beijing (CN); Min Zhou, Beijing (CN); Guichun Hong, Beijing (CN); Zhendian Wu, Beijing (CN); Hao Cheng, Beijing (CN); Yawen Huang, Beijing (CN); Zihua Zhuang, Beijing (CN)

(73) Assignees: FUZHOU BUE OPTOELECTRONICS TECHNOLOGY CO., LTD., FUJIAN (CN); BOE TECHNOLOGY GROUP CO., LTD., Beijing (CN)

( * ) Notice: Subject to any disclaimer, the term of this patent is extended or adjusted under 35 U.S.C. 154(b) by 294 days.

(21) Appl. No.: 16/956,074

(22) PCT Filed: Dec. 17, 2019

(86) PCT No.: PCT/CN2019/125836
§ 371 (c)(1),
(2) Date: Jun. 19, 2020

(87) PCT Pub. No.: WO2020/140744
PCT Pub. Date: Jul. 9, 2020

(65) Prior Publication Data
US 2021/0199986 A1    Jul. 1, 2021

(30) Foreign Application Priority Data

Jan. 3, 2019    (CN) .......................... 201910005789.2

(51) Int. Cl.
*G02B 30/31*    (2020.01)
*H04N 13/31*    (2018.01)
(Continued)

(52) U.S. Cl.
CPC ......... *G02B 30/31* (2020.01); *G02F 1/13306* (2013.01); *G02F 1/13439* (2013.01);
(Continued)

(58) Field of Classification Search
CPC ............. G02B 30/30–32; H04N 13/31; H04N 13/312; H04N 13/315; G02F 1/167; G02F 1/169; G09G 3/344
See application file for complete search history.

(56) References Cited

U.S. PATENT DOCUMENTS

| 7,408,696 B2 | 8/2008 | Liang et al. | |
| 2008/0211734 A1* | 9/2008 | Huitema | H04N 13/359 345/3.1 |

(Continued)

FOREIGN PATENT DOCUMENTS

| CN | 102654706 A | 9/2012 |
| CN | 103246123 A | 8/2013 |

(Continued)

OTHER PUBLICATIONS

International search report of PCT application No. PCT/CN2019/125836 dated Mar. 27, 2020.
(Continued)

*Primary Examiner* — Alexander P Gross
(74) *Attorney, Agent, or Firm* — Lippes Mathias LLP (57) ABSTRACT

The grating substrate includes a first base substrate and a plurality of grating units on the first base substrate. The grating unit includes two control layers, a barrier structure between the two control layers, and a plurality of movable particles in a closed cavity surrounded by the barrier structure and the two control layers. The two control layers
(Continued)

include a first control layer and a second control layer. The first control layer is located on a side of the second control layer distal from the first base substrate, and the two control layers are configured to control movement of the plurality of particles. The particles satisfy at least one of the following conditions: the particles have a refractive index smaller than a refractive index of the first control layer, or the particles are non-transparent particles.

20 Claims, 4 Drawing Sheets

(51) Int. Cl.
  *G02F 1/1677* (2019.01)
  *G02F 1/133* (2006.01)
  *G02F 1/1335* (2006.01)
  *G02F 1/1343* (2006.01)
  *G02F 1/167* (2019.01)
  *H10K 59/50* (2023.01)

(52) U.S. Cl.
  CPC ........ *G02F 1/133553* (2013.01); *G02F 1/167* (2013.01); *G02F 1/1677* (2019.01); *H04N 13/31* (2018.05); *H10K 59/50* (2023.02)

(56) References Cited

U.S. PATENT DOCUMENTS

| | | |
|---|---|---|
| 2009/0308750 A1 | 12/2009 | Jang et al. |
| 2012/0188230 A1* | 7/2012 | Li .......................... G02B 30/24 349/138 |
| 2016/0301921 A1* | 10/2016 | Zhang .................. H04N 13/398 |
| 2017/0271417 A1* | 9/2017 | Jia ....................... H01L 27/3232 |
| 2018/0088411 A1 | 3/2018 | Zhang |
| 2018/0088433 A1* | 3/2018 | Gu ......................... G02F 1/1677 |
| 2018/0088434 A1 | 3/2018 | Liang et al. |
| 2018/0188599 A1* | 7/2018 | Wang ................ G02F 1/133602 |
| 2019/0004388 A1 | 1/2019 | Qiu et al. |
| 2019/0049814 A1* | 2/2019 | Whitehead ........ G02F 1/134309 |

FOREIGN PATENT DOCUMENTS

| | | | | |
|---|---|---|---|---|
| CN | 105700212 A | * | 6/2016 | ....... G02F 1/133528 |
| CN | 106154678 A | | 11/2016 | |
| CN | 106200198 A | * | 12/2016 | .......... G02B 26/026 |
| CN | 106292120 A | | 1/2017 | |
| CN | 106328016 A | | 1/2017 | |
| CN | 109541813 A | | 3/2019 | |
| JP | 2009053392 A | | 3/2009 | |

OTHER PUBLICATIONS

First office action of Chinese application No. 201910005789.2 dated Jan. 6, 2020.

* cited by examiner

GRATING SUBSTRATE, DISPLAY SUBSTRATE, DISPLAY DEVICE AND DISPLAY METHOD THEREOF

CROSS-REFERENCE TO RELATED APPLICATION

The application is a 371 application based on PCT/CN2019/125836 filed on Dec. 17, 2019, which claims priority to Chinese Patent Application No. 201910005789.2, filed on Jan. 3, 2019 and entitled "Display substrate, display device and display method of display device", the entire contents of which are incorporated herein by reference.

TECHNICAL FIELD

The present discourse relates to the technical field of display, and more particularly to a grating substrate, a display substrate, a display device and a display method thereof.

BACKGROUND

The rapid development in display technologies has given rise to a development of a naked-eye three-dimensional (3D) display screen with a naked-eye 3D display technology. The naked-eye 3D display screen enables a user to view 3D images with naked eyes, and the current naked-eye 3D display technologies mainly includes a parallax barrier display technology and a prism display technology.

SUMMARY

Embodiments of the present disclosure provide a grating substrate, a display substrate, a display device and a display method thereof. The technical solutions are as follows:

In one aspect, a grating substrate is provided. The grating substrate includes: a first base substrate and a plurality of grating units on the first base substrate, wherein the grating unit includes two control layers, a barrier structure between the two control layers, and a plurality of movable particles in a closed cavity surrounded by the barrier structure and the two control layers, wherein the two control layers include a first control layer and a second control layer, the first control layer being located on a side of the second control layer distal from the first base substrate, and the two control layers being configured to control movement of the plurality of particles; and wherein the particles satisfy at least one of the following conditions: the particles have a refractive index smaller than a refractive index of the first control layer, or the particles are non-transparent particles.

Optionally, the first control layer includes a first transparent electrode, the second control layer includes a second transparent electrode, the particles are charged particles; and the particles having the refractive index smaller than the refractive index of the first control layer includes that: the charged particles have a refractive index smaller than a refractive index of the first transparent electrode.

Optionally, the first control layer includes a first transparent electrode and a reflective film that are stacked, the reflective film being located on a side of the first transparent electrode proximal to the first base substrate, the second control layer includes a second transparent electrode, the particles are charged particles; and the particles having the refractive index smaller than the refractive index of the first control layer includes that: the charged particles have a refractive index smaller than a refractive index of the reflective film.

Optionally, the grating unit further includes a driving circuit configured to apply a voltage between the first transparent electrode and the second transparent electrode.

Optionally, a surface of the first control layer proximal to the second control layer is provided with a plurality of convex curved surfaces arranged in an array.

Optionally, the convex curved surface is one of a hemispherical surface and a semi-ellipsoidal surface.

Optionally, the particles are black ink particles.

Optionally, the plurality of grating units are arranged in a matrix.

Optionally, the plurality of grating units are arranged in a matrix; and a surface of the first control layer proximal to the second control layer is provided with a plurality of convex curved surfaces arranged in an array, wherein the convex curved surface is one of a hemispherical surface and a semi-ellipsoidal surface, and the particles are black ink particles.

In another aspect, a display substrate is provided. The display substrate includes: a light emitting substrate and a grating substrate as defined in any one of the one aspect, wherein the light emitting substrate includes a second base substrate and a plurality of light emitting units on the second base substrate, the light emitting substrate and the grating substrate are oppositely arranged, and the plurality of light emitting units are arranged in one-to-one correspondence with a plurality of grating units in the grating substrate.

Optionally, a first control layer in the grating unit includes a first transparent electrode, and the light emitting unit includes a third electrode, a light emitting layer, and a fourth transparent electrode that are stacked along a direction away from the second base substrate; and the fourth transparent electrode is multiplexed with the first transparent electrode.

Optionally, a first control layer in the grating unit includes a first transparent electrode, and the light emitting unit includes a third electrode, a light emitting layer, a fourth transparent electrode, and an insulating layer that are stacked along a direction away from the second base substrate; and the first transparent electrode is located on a side of the insulating layer distal from the second base substrate.

Optionally, the display substrate further includes a baffle structure between two adjacent light emitting units, wherein one end of the baffle structure is connected to the first base substrate in the grating substrate, and the other end of the baffle structure is connected to the second base substrate.

Optionally, the baffle structure is a non-light-transmitting structure.

Optionally, the display substrate is one of an organic light emitting diode display substrate and a quantum dot light emitting diode.

In yet another aspect, a display device is provided. The display device includes the display substrate as defined in any one of the another aspect.

In still another aspect, a display method for a display device is provided. The method is applied to the display device as defined in the another aspect, the display device including a plurality of display units arranged in a matrix, and the display unit including a light emitting unit and a grating unit that are stacked, the method including:

acquiring a three-dimensional display direction of the display device when the display device is configured to display a three-dimensional image;

performing, when the three-dimensional display direction is a row arrangement direction of the plurality of display units, a darkening operation on each of the display units in a target column to enable each of the display units in the target column to be in a dark state; and performing, when the three-dimensional display direction is a column arrangement direction of the plurality of display units, the darkening operation on each of the display units in a target row to enable each of the display units in the target row to be in the dark state;

wherein the darkening operation includes:

moving, under a control action of a first control layer and a second control layer in the grating unit, a plurality of particles in a closed cavity of the grating unit to a target surface, to inhibit the grating unit from transmitting light, wherein the target surface includes one of an inner surface of the first control layer and an inner surface of the second control layer when the particles are non-transparent particles, and the target surface includes the inner surface of the first control layer when the particles have a refractive index smaller than a refractive index of the first control layer.

Optionally, the first control layer includes a first transparent electrode, the second control layer includes a second transparent electrode, the particles are charged particles, and the charged particles have a refractive index smaller than a refractive index of the first transparent electrode; and moving, under the control action of the first control layer and the second control layer in the grating unit, the plurality of particles in the closed cavity of the grating unit to the target surface, includes:

moving, by applying a first voltage between the first transparent electrode and the second transparent electrode, the plurality of particles in the closed cavity to a surface of the first transparent electrode proximal to the second control layer.

Optionally, the first control layer includes a first transparent electrode and a reflective film that are stacked, the reflective film being located on a side of the first transparent electrode proximal to the first base substrate, the second control layer includes a second transparent electrode, the particles are charged particles, and the charged particles have a refractive index smaller than a refractive index of the reflective film; and moving, under the control action of the first control layer and the second control layer in the grating unit the plurality of particles in the closed cavity of the grating unit to the target surface, includes:

moving, by applying a first voltage between the first transparent electrode and the second transparent electrode, the plurality of particles in the closed cavity to a surface of the reflective film proximal to the second control layer.

Optionally, the method further includes:

performing, when the display device is configured to display a two-dimensional image, a brightening operation on each of the display units wherein the brightening operation includes:

moving, under the control action of the first control layer and the second control layer in the grating unit, the plurality of particles in the closed cavity of the grating unit to be distal from the target surface, to enable the first control layer to transmit light emitted from the light emitting unit.

DETAILED DESCRIPTION

For clearer descriptions of the objects, technical solutions and advantages in the embodiments of the present disclosure, the present disclosure is described in detail below in combination with the accompanying drawings.

Currently, the process of realizing naked-eye 3D display by the parallax barrier display technology includes: arranging a grating substrate (generally a slit grating) on a light emitting side of the display panel. The grating substrate includes a plurality of columnar grids arranged in parallel. When a connecting line between the left eye and right eye is parallel to an arrangement direction of the plurality of columnar grids, the grating substrate is able to form a parallax barrier, so that visual images of the left eye and visual images of the right eye have a certain difference, and thereby a 3D display effect of the display panel is realized through the parallax effect between the left and right eyes. However, since the shape of the grating substrate is fixed, the 3D display effect can be presented into eyes of the user only when the connecting line between the left eye and right eye of the user is parallel to the arrangement direction of the plurality of columnar grids. Thus, flexibility of the 3D display on the current display panel is poor.

Figure 1:
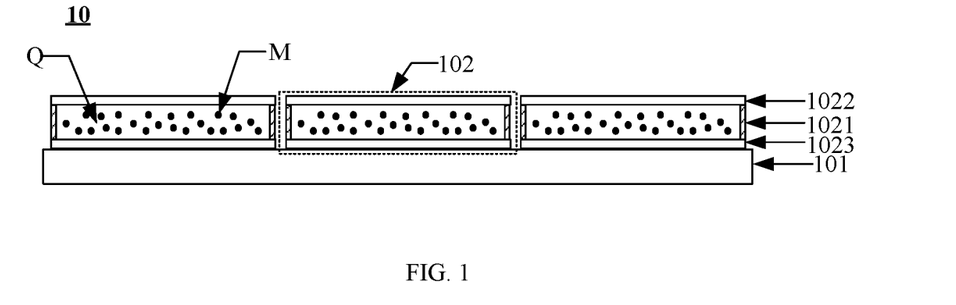
FIG. 1 is a structure diagram of a grating substrate provided by an embodiment of the present disclosure.

FIG. 1 is a structure diagram of a grating substrate provided by an embodiment of the present disclosure. As shown in FIG. 1, the grating substrate 10 includes a first base substrate 101 and a plurality of grating units 102 on the first base substrate 101. Optionally, the plurality of grating units 102 in the grating substrate 10 are arranged in a matrix.

Referring to FIG. 1, the grating unit 102 includes two control layers, a barrier structure 1021 between the two control layers, and a plurality of movable particles M in a closed cavity Q surrounded by the barrier structure 1021 and the two control layers. The two control layers include a first control layer 1022 and a second control layer 1023. The first control layer 1022 is located on a side of the second control layer 1023 distal from the first base substrate 101. The two control layers are configured to control movement of the plurality of particles. For example, the two control layers may be configured to control the plurality of particles M to move close to or away from the first control layer 1022. The particles M satisfy at least one of the following conditions: the particles M have a refractive index smaller than a refractive index of the first control layer 1022, or the particles M are non-transparent particles. That is, the particles M may have the refractive index smaller than the refractive index of the first control layer 1022; or, the particles M may be non-transparent particles; or, the particles M are non-transparent particles and at the same time have the refractive index smaller than the refractive index of the first control layer 1022.

In a first case, the particles M have the refractive index smaller than the refractive index of the first control layer 1022. When the two control layers control the plurality of particles to move to an inner surface of the first control layer, since the particles have the refractive index smaller than the refractive index of the first control layer (that is, the first control layer is an optically denser medium, and the particles are an optically thinner medium), the light incident from a direction of the first control layer away from the second control layer may be totally reflected on a surface of the first control layer proximal to the second control layer if an incident angle θ of the light on the surface of the first control layer proximal to the second control layer is greater than or equal to a critical angle (that is, sin θ is greater than or equal to n1/n2, where n1 is the refractive index of the particles, and n2 is the refractive index of the first control layer). When the two control layers control the plurality of particles to be dispersed in the closed cavity, the light may be transmitted from the first control layer, the closed cavity, and the second control layer in sequence. Optionally, if the particles are transparent particles, when the two control layers control the plurality of particles to move to the inner surface of the second control layer, the light may also be transmitted from the first control layer, the closed cavity, and the second control layer in sequence.

In a second case, the particles M are non-transparent particles. Optionally, the particles may be black ink particles. When the black ink particles move to the inner surface of the first control layer or the second control layer, the black ink particles may fully absorb the light incident on the grating unit. That is, the light fails to be transmitted from the grating unit. When the black ink particles are dispersed in the closed cavity, the light incident on the grating unit may be transmitted from the grating unit.

In a third case, the particles M have the refractive index smaller than the refractive index of the first control layer 1022, and the particles M are non-transparent particles. In this case, the light emitting principle of the grating unit may refer to the related descriptions in the first and second cases above, which is not described repeatedly here in the embodiment of the present disclosure.

In summary, the grating substrate provided by the embodiment of the present disclosure controls movement of the plurality of particles by the two control layers in the grating unit. When the grating units in a target row in the grating substrate cannot transmit the light, the grating units in the target row may be equivalent to gratings arranged along a column arrangement direction of the grating substrate. When the grating units in a target column in the grating substrate cannot transmit the light, the grating units in the target column may be equivalent to gratings arranged along a row arrangement direction of the grating substrate. According to the grating substrate provided by the embodiment of the present disclosure, the gratings can be switched between lateral and longitudinal directions, which thereby improves flexibility of the 3D display on the display substrate.

Figure 2:
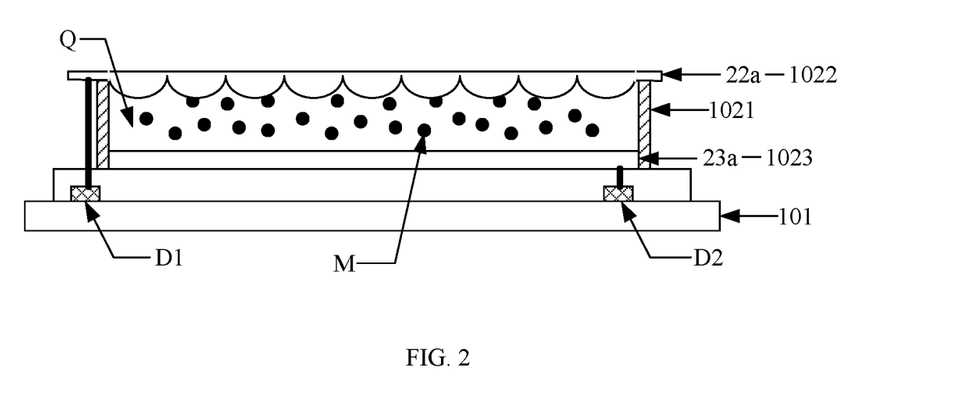
FIG. 2 is a structure diagram of a grating unit provided by an embodiment of the present disclosure.

Optionally, FIG. 2 is a structure diagram of a grating unit provided by an embodiment of the present disclosure. As shown in FIG. 2, the first control layer 1022 includes a first transparent electrode 22a; the second control layer 1023 includes a second transparent electrode 23a; and the particles M are charged particles. The particles in the closed cavity Q having refractive index smaller than the refractive index of the first control layer 1022 includes that: the charged particles M in the closed cavity Q have a refractive index smaller than a refractive index of the first transparent electrode 22a.

It should be noted that the light incident from the direction of the first control layer away from the second control layer is totally reflected by the grating unit when the charged particles are moved to the inner surface of the first transparent electrode by applying a first voltage between the first transparent electrode and the second transparent electrode. The light incident from the direction of the first control layer away from the second control layer is transmitted by the grating unit when the charged particles are dispersed in the closed cavity by applying a second voltage between the first transparent electrode and the second transparent electrode. The second voltage herein is zero, which indicates that the potentials on the first transparent electrode and the second transparent electrode are equal. Alternatively, when the charged particles are transparent particles, the charged particles are moved to the inner surface of the second transparent electrode by applying a voltage between the first transparent electrode and the second transparent electrode.

Figure 3:
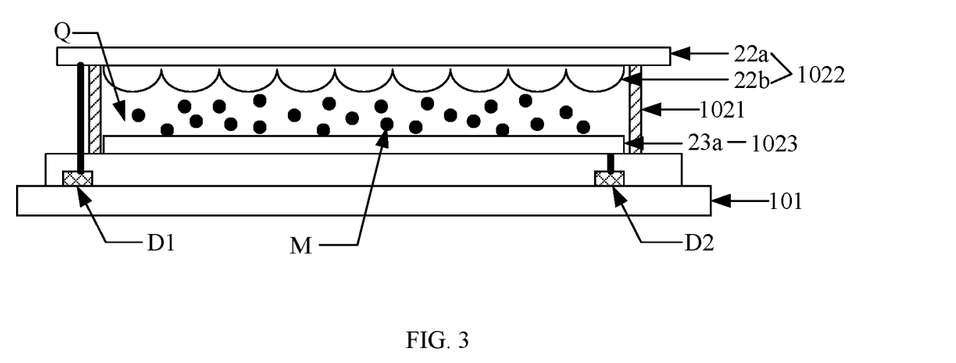
FIG. 3 is a structure diagram of another grating unit provided by an embodiment of the present disclosure.

Optionally, FIG. 3 is a structure diagram of another grating unit provided by an embodiment of the present disclosure. As shown in FIG. 3, the first control layer 1022 includes a first transparent electrode 22a and a reflective film 22b that are stacked. The reflective film 22b is located on a side of the first transparent electrode 22a proximal to the first base substrate 101; the second control layer 1023 includes a second transparent electrode 23a; and the particles M are charged particles. The particles in the closed cavity Q having the refractive index smaller than the refractive index of the first control layer 1022 includes that: the charged particles M in the closed cavity Q have a refractive index smaller than a refractive index of the reflective film 22b.

It should be noted that the light emitting principle of the grating unit shown in FIG. 3 refers to the description of the light emitting principle of the grating unit shown in FIG. 2, which is not described repeatedly here in the embodiment of the present disclosure.

Optionally, a surface of the first control layer proximal to the second control layer is provided with a plurality of convex curved surfaces arranged in an array.

With continued reference to FIG. 2, a surface of the first transparent electrode 22a proximal to the second transparent electrode 23a is composed of a plurality of convex curved surfaces arranged in an array. Optionally, the plurality of convex curved surfaces arranged in an array may be formed on the surface of the first transparent electrode proximal to the second transparent electrode by imprinting or patterning process. The patterning process herein includes photoresist coating, exposure, development, etching, and photoresist stripping.

With continued reference to FIG. 3, a surface of the reflective film 22b proximal to the second transparent electrode 23a is composed of a plurality of convex curved surfaces arranged in an array. Optionally, the reflective film may be a hemispherical reflective film. The first control layer may be obtained by attaching the hemispherical reflective film to a side of the first transparent electrode proximal to the second transparent electrode.

Optionally, the convex curved surface may be a hemispherical surface or a semi-ellipsoidal surface, or other shapes of convex curved surface. The embodiment of the present disclosure does not limit the shape of the convex curved surface.

It should be noted that since the surface of the first control layer proximal to the second control layer (that is, the inner surface of the first control layer) is composed of a plurality of convex curved surfaces arranged in an array, the incident angle of the light on the inner surface of the first control layer can be increased when the light is incident on the grating unit from a side of the first control layer distal from the second control layer. When the charged particles are moved to the inner surface of the first control layer, it can ensure that the light is totally reflected on the inner surface of the first control layer.

Optionally, the grating unit also includes a driving circuit configured to apply a voltage between the first transparent electrode and the second transparent electrode. Exemplarily, referring to FIG. 2 and FIG. 3, the driving circuit includes two voltage control units that are insulated from each other and located on the first base substrate 101. The two voltage control units are respectively configured to supply power to the first transparent electrode and the second transparent electrode. The first transparent electrode 22a is electrically connected to the voltage control unit D1, and the second transparent electrode 23a is electrically connected to the voltage control unit D2. In other words, the voltage control unit D1 is configured to supply power to the first transparent electrode 22a, and the voltage control unit D2 is configured to supply power to the second transparent electrode 23a.

Optionally, the first control layer and the second control layer may also be in a magnetic field control structure, and the particles in the closed cavity are magnetic particles. The light emitting principle of the grating unit in this structure may refer to the light emitting principle of the grating unit as shown in FIG. 2 or FIG. 3, which is not repeated here in the embodiment of the present disclosure.

In summary, the grating substrate provided by the embodiment of the present disclosure controls movement of the plurality of particles by the two control layers in the grating unit. When the grating units in the target row in the grating substrate cannot transmit light, the grating units in the target row may be equivalent to gratings arranged along a column arrangement direction of the grating substrate. When the grating units in the target column in the grating substrate cannot transmit light, the grating units in the target column may be equivalent to gratings arranged along a row arrangement direction of the grating substrate. According to the grating substrate provided by the embodiment of the present disclosure, the gratings can be switched between lateral and longitudinal directions, which thereby improves flexibility of the 3D display on the display substrate.

Figure 4:
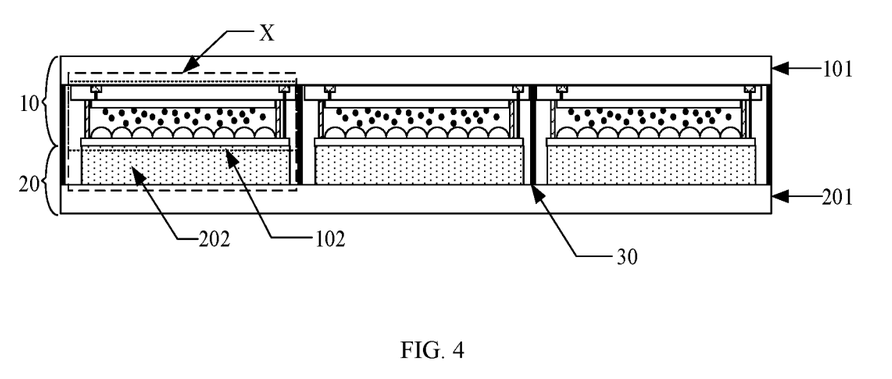
FIG. 4 is a structure diagram of a display substrate provided by an embodiment of the present disclosure.

FIG. 4 is a structure diagram of a display substrate provided by an embodiment of the present disclosure. As shown in FIG. 4, the display substrate includes a light emitting substrate 20 and a grating substrate 10. In the embodiment of the present disclosure, taking the grating substrate 10 including the grating unit shown in FIG. 3 as an example for illustration.

Referring to FIG. 4, the light emitting substrate 20 includes a second base substrate 201 and a plurality of light emitting units 202 on the second base substrate 201. The light emitting substrate 20 and the grating substrate 10 are oppositely arranged. That is, the second base substrate 201 is located on a side of the light emitting unit 202 distal from the first base substrate 101, and the first base substrate 101 is located on a side of the grating unit 102 distal from the second base substrate 201. The plurality of light emitting units 202 in the light emitting substrate 20 are arranged in one-to-one correspondence with a plurality of grating units 102 in the grating substrate 10. In the embodiment of the present disclosure, a light emitting unit 202 and a grating unit 102 that are correspondingly arranged are referred to as a display unit X. That is, a display unit X includes a light emitting unit 202 and a grating unit 102 that are stacked. A display unit may correspond to a pixel. For example, the display unit may correspond to a red pixel, a green pixel, or a blue pixel.

It should be noted that the display state of the display unit is a bright state when the grating unit in the display unit can transmit the light emitted from the light emitting unit, and the display state of the display unit is a dark state when the grating unit in the display unit cannot transmit the light emitted from the light emitting unit, for example, when the grating unit totally reflects or absorbs the light emitted from the light emitting unit.

Figure 5:
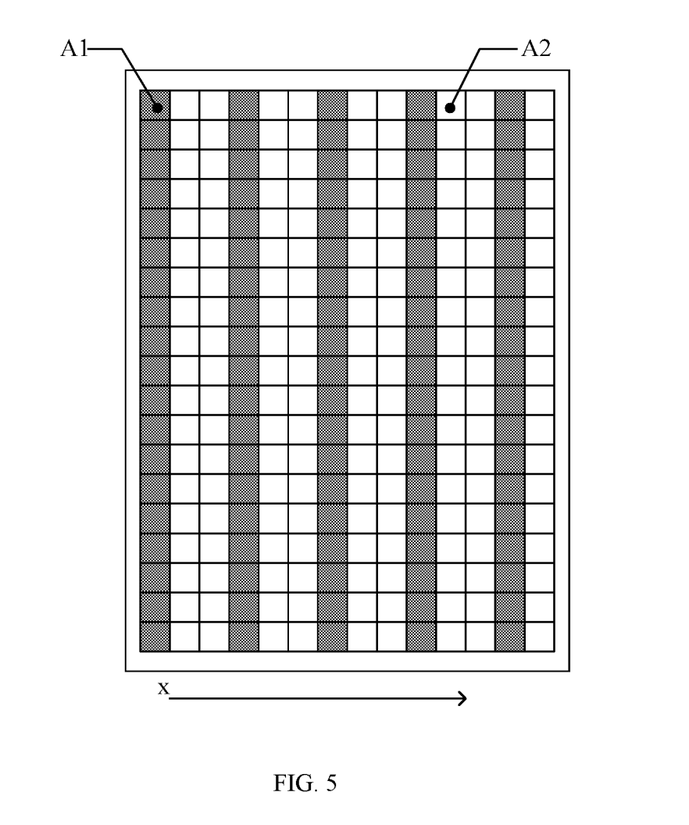
FIG. 5 is a display diagram of a display substrate provided by an embodiment of the present disclosure.

Exemplarily, FIG. 5 is a display diagram of a display substrate provided by an embodiment of the present disclosure. As shown in FIG. 5, when the display units A1 in the target column in the display substrate are in a dark state, the multiple columns of display units A1 in the dark state may be equivalent to gratings arranged along a first direction x. The 3D display effect can be realized in the first direction x when the display substrate displays images by the display unit A2 in the bright state. That is, when a connecting line between the left eye and right eye of the user is parallel to the first direction x, the 3D display effect can be presented into the eyes of the user.

Figure 6:
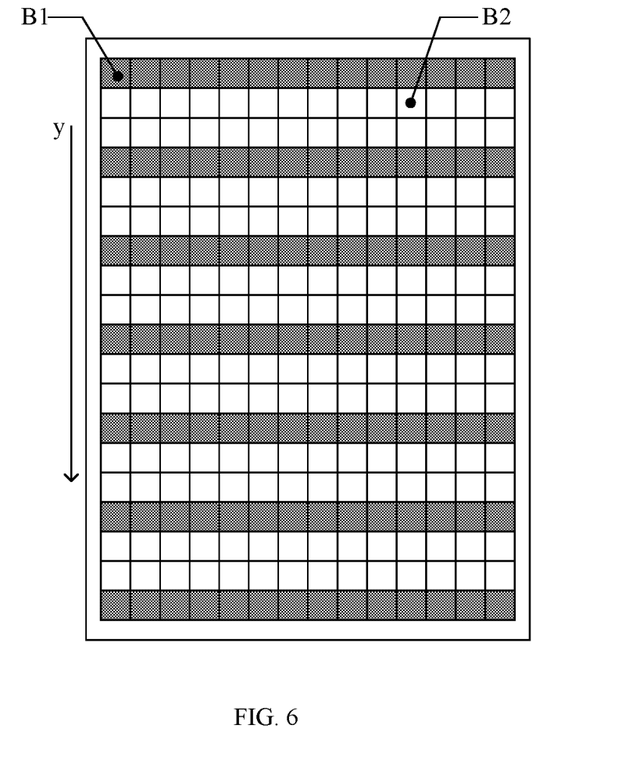
FIG. 6 is a display diagram of another display substrate provided by an embodiment of the present disclosure.

Further, FIG. 6 is a display schematic diagram of another display substrate provided by an embodiment of the present disclosure. As shown in FIG. 6, when the display units B1 in the target row in the display substrate are in a dark state, the multiple rows of display units B1 in the dark state may be equivalent to gratings arranged along a second direction y. The 3D display effect can be realized in the second direction y when the display substrate displays images by the display unit B2 in the bright state. That is, when the connecting line between the left eye and right eye of the user is parallel to the second direction y, the 3D display effect can be presented into the eyes of the user. The first direction herein is a row arrangement direction of the plurality of display units (that is, a lateral direction of the display substrate), and the second direction is a column arrangement direction of the plurality of display units (that is, a longitudinal direction of the display substrate).

Figure 7:
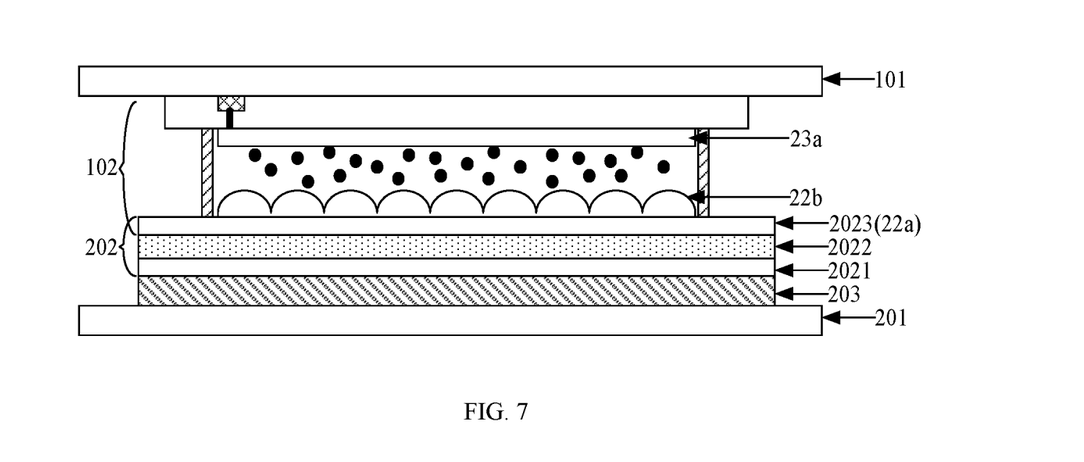
FIG. 7 is a structure diagram of a display unit provided by an embodiment of the present disclosure.

Optionally, FIG. 7 is a structure diagram of a display unit provided by an embodiment of the present disclosure. As shown in FIG. 7, the light emitting unit 202 includes a third electrode 2021, a light emitting layer 2022, and a fourth transparent electrode 2023 that are stacked along a direction away from the second base substrate 201. The fourth transparent electrode 2023 is multiplexed with the first transparent electrode 22a.

It should be noted that when the first transparent electrode is multiplexed with the fourth transparent electrode, a voltage control unit for applying voltage to the first transparent electrode does not need to be separately prepared on the first substrate during the process of preparing the grating substrate, which can simplify the preparation process of the driving circuit and further the preparation process of the grating substrate.

Figure 8:
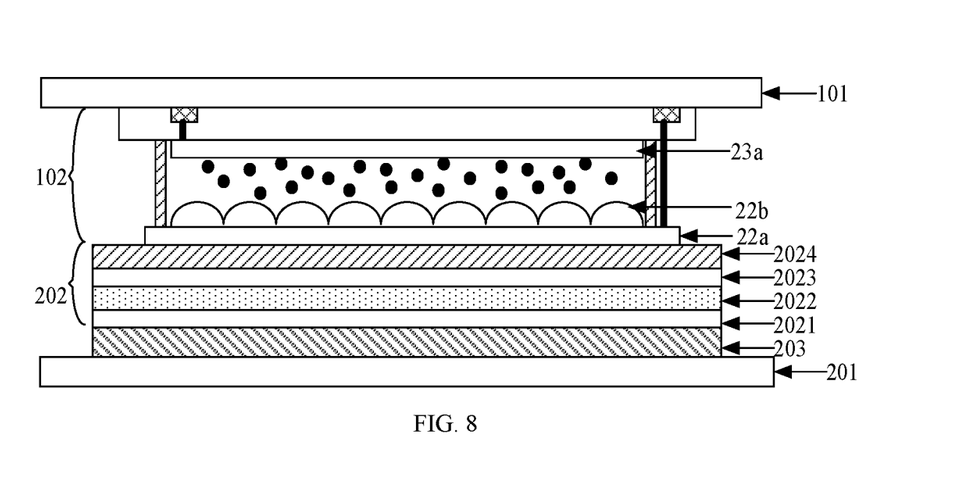
FIG. 8 is a structure diagram of another display unit provided by an embodiment of the present disclosure.

Optionally, FIG. 8 is a structure diagram of another display unit provided by an embodiment of the present disclosure. As shown in FIG. 8, the light emitting unit 202 includes a third electrode 2021, a light emitting layer 2022, a fourth transparent electrode 2023, and an insulating layer 2024 that are stacked along a direction away from the second base substrate 201. The first transparent electrode 22a is located on a side of the insulating layer 2024 distal from the second base substrate 201.

In the display unit shown in FIG. 7 and FIG. 8, the third electrode and the fourth transparent electrode are one of an anode and a cathode, respectively. The light emitting layer includes a first carrier-injection layer, a first carder-transport layer, a light emitting material layer, a second carrier-transport layer, and a second carrier-injection layer that are stacked along a direction away from the second base substrate. When the third electrode is an anode and the fourth transparent electrode is a cathode, the first carrier is a hole and the second carrier is an electron: whereas when the third electrode is a cathode and the fourth transparent electrode is an anode, the first carrier is an electron and the second carrier is a hole.

Optionally, the light emitting material layer may be prepared from an organic light emitting material, and the display substrate is an organic light emitting diode (OLED) display substrate. Alternatively, the light emitting material layer may also be prepared from a quantum dot material, and the aforesaid display substrate is a quantum dot light emitting diode (QLED) display substrate.

Optionally, with continued reference to FIG. 7 and FIG. 8, the display unit further includes a thin-film transistor (TFT) 203. The TFT 203 is located between the second base substrate 201 and the light emitting unit 202. The TFT herein may be a top-gate structure or a bottom-gate structure, which is not limited in the embodiment of the present disclosure.

Optionally, the aforesaid light emitting unit may also be a light emitting unit in a liquid crystal display panel. The light emitting unit includes an array substrate, a color filter substrate, and a liquid crystal layer between the array substrate and the color filter substrate.

Optionally, referring to FIG. 4, a baffle structure 30 is arranged between any two adjacent display units X among the plurality of display units of the display substrate, and the baffle structure 30 is a non-light-transmitting structure. That is, the display substrate further includes a baffle structure 30 between two adjacent light emitting units 202. One end of the baffle structure 30 is connected to the first base substrate 101 in the grating substrate 10, and the other end of the baffle structure 30 is connected to the second base substrate 201 in the light emitting substrate 20.

It should be noted that light crosstalk between adjacent display units can be prevented by disposing the baffle structure that is non-light-transmitting between the two adjacent display units, so that an independent display state of each of the display units is ensured.

In summary, in the display substrate provided by the embodiment of the present disclosure, the display unit includes a grating unit and a light emitting unit. The display units can be switched between the dark state and the bright state by controlling movement of the plurality of particles with the two control layers in the grating unit. When the display units in the target row in the display substrate are in a dark state, the multiple rows of display units in the dark state may be equivalent to the gratings arranged along the column arrangement direction of the display unit; and when the display units in the target column in the display substrate are in a dark state, the multiple columns of display units in the dark state may be equivalent to the gratings arranged along the row arrangement direction of the display unit. In the display substrate provided by the embodiment of the present disclosure, the grating substrate can realize a switching between lateral and longitudinal directions of the gratings, and thus can be realize the 3D display effect of the display substrate in different directions, which improves flexibility of the 3D display on the display substrate.

An embodiment of the present disclosure provides a display device, including the display substrate as shown in FIG. 4.

Optionally, the display device provided by the embodiment of the present disclosure may be an OLED display device, a QLED display device, or a liquid crystal display device. The display device may be specifically a piece of electronic paper, a mobile phone, a tablet computer, a TV set, a display, a notebook computer, a digital photo frame, and a navigator, etc.

In summary, in the display device provided by the embodiment of the present disclosure, the display unit includes a grating unit and a light emitting unit. The display units can be switched between the dark state and the bright state by controlling movement of the plurality of particles with the two control layers in the grating unit. When the display units in the target row in the display substrate are in a dark state, the multiple rows of display units in the dark state may be equivalent to the gratings arranged along the column arrangement direction of the display unit; and when the display units in the target column in the display substrate are in a dark state, the multiple columns of display units in the dark state may be equivalent to the gratings arranged along the row arrangement direction of the display unit. In the display device provided by the embodiment of the present disclosure, the grating substrate can realize a switching between lateral and longitudinal directions of the gratings, and thus can be realize the 3D display effect of the display substrate in different directions, which improves flexibility of the 3D display on the display device.

Figure 9:
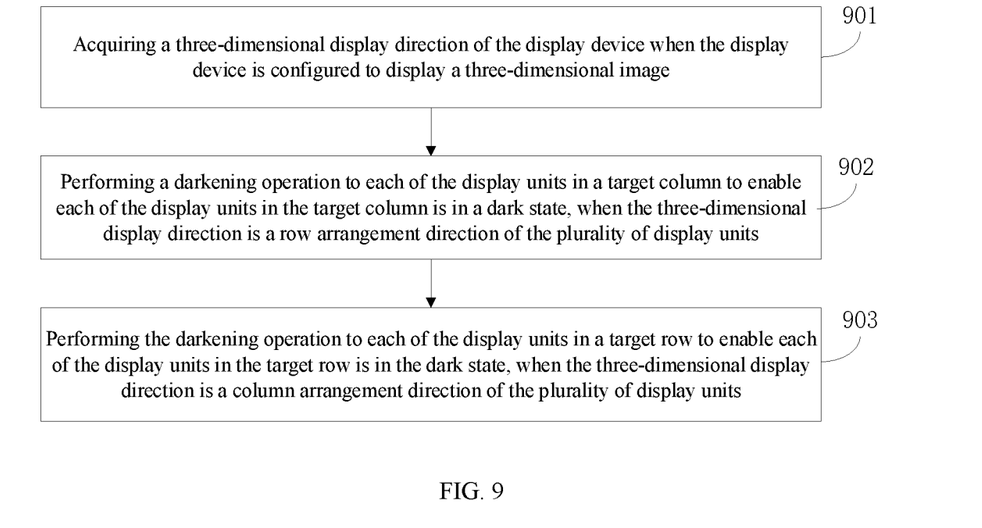
FIG. 9 is a flowchart of a display method for a display device provided by an embodiment of the present disclosure.

FIG. 9 is a flowchart of a display method for a display device provided by an embodiment of the present disclosure. The method is applied to the aforesaid display device, and the display device includes a plurality of display units arranged in a matrix. As shown in FIG. 9, the method includes following steps.

In step 901, a three-dimensional display direction of the display device is acquired when the display device is configured to display a three-dimensional image.

Optionally, the display direction of the image on the display device may be detected by a built-in sensor of the display device. When the image is displayed in a portrait orientation on the display device, the three-dimensional display direction is determined to be the row arrangement direction of the plurality of display units in the display device; and when the image is displayed in a landscape orientation on the display device, the three-dimensional display direction is determined to be the column arrangement direction of the plurality of display units in the display device.

In step 902, a darkening operation is performed, when the three-dimensional display direction is the row arrangement direction of the plurality of display units, on each of the display units in a target column to enable each of the display units in the target column to be in a dark state.

Exemplarily, referring to FIG. 5, when the display units A1 in the target column in the display device are in the dark state, the multiple columns of display units A1 in the dark state may be equivalent to gratings arranged along the first direction x. The 3D display effect can be realized in the first direction x when the display device displays the image by the display unit A2 in a bright state. That is, when a connecting line between the left eye and right eye of the user is parallel to the first direction x, the 3D display effect can be presented into the eyes of the user. The first direction herein is the row arrangement direction of the plurality of display units (that is, a lateral direction of the display substrate).

In step 903, the darkening operation is performed, when the three-dimensional display direction is the column arrangement direction of the plurality of display units, on each of the display units in a target row to enable each of the display units in the target row to be in a dark state.

Exemplarily, referring to FIG. 6, when the display units B1 in the target row in the display substrate are in the dark state, the multiple rows of display units B1 in the dark state may be equivalent to gratings arranged along the second direction y. The 3D display effect can be realized in the second direction y when the display substrate displays the image by the display unit B2 in the bright state. That is, when the connecting line the left eye and right eye of the user is parallel to the second direction y, the 3D display effect can be presented into the eyes of the user. The second direction herein is the column arrangement direction of the plurality of display units (that is, a longitudinal direction of the display substrate).

The darkening operation includes moving, under the control action of the first control layer and the second control layer in the grating unit, a plurality of particles in a closed cavity of the grating unit, to a target surface to inhibit the grating unit from transmitting the light. The target surface includes one of an inner surface of the first control layer and an inner surface of the second control layer when the particles in the closed cavity are non-transparent particles. That is, the darkening operation includes moving under the control action of the first control layer and the second control layer in the grating unit, the plurality of particles in the closed cavity of the grating unit to the inner surface of the first control layer or the inner surface of the second control layer, to enable the non-transparent particles on the inner surface of the first control layer or the inner surface of the second control layer to adsorb the light emitted from the light emitting unit. The target surface includes the inner surface of the first control layer when the particles in the closed cavity have a refractive index smaller than a refractive index of the first control layer. That is, the darkening operation includes moving, under the control action of the first control layer and the second control layer in the grating unit, the plurality of particles in the closed cavity of the grating unit to the inner surface of the first control layer, to enable the first control layer to totally reflect the light emitted from the light emitting unit. The inner surface of the first control layer herein refers to a surface of the first control layer opposite to the second control layer, and the inner surface of the second control layer refers to a surface of the second control layer opposite to the first control layer.

Optionally, referring to FIG. 2, in the grating unit, the first control layer 1022 includes a first transparent electrode 22a, the second control layer 1023 includes a second transparent electrode 23a, and the particles M are charged particles. The charged particles have a refractive index smaller than a refractive index of the first transparent electrode. Thus, the implementation of moving, under the control action of the first control layer and the second control layer in the grating unit, the plurality of particles in the closed cavity of the grating unit to the target surface, includes: moving, by applying a first voltage between the first transparent electrode and the second transparent electrode, the plurality of particles in the closed cavity to an inner surface of the first transparent electrode (that is, a surface of the first transparent electrode close to the second control layer).

Optionally, referring to FIG. 3, the first control layer 1022 includes a first transparent electrode 22a and a reflective film 22b that are stacked. The reflective film 22b is located on a side of the first transparent electrode 22a proximal to the first base substrate 101; the second control layer 1023 includes a second transparent electrode 23a; and the particles M are charged particles. The charged particles have a refractive index smaller than a refractive index of the reflective film. Thus, the implementation of moving, under the control action of the first control layer and the second control layer, the plurality of particles in the closed cavity to the target surface, includes: moving, by applying a first voltage between the first transparent electrode and the second transparent electrode, the plurality of particles in the closed cavity to a surface of the reflective film proximal to the second control layer.

Optionally, the display device provided by the embodiment of the present disclosure may also be configured to display a two-dimensional image, and the two-dimensional image display mode and the three-dimensional image display mode are switchable. A brightening operation is performed, when the display device is configured to display the two-dimensional image, on each of the display units. The brightening operation includes: moving, under the control action of the first control layer and the second control layer in the grating unit, the plurality of particles in the closed cavity of the grating unit to be distal from the target surface, to enable the first control layer to transmit the light emitted from the light emitting unit. Optionally, the brightening operation includes: dispersing the charged particles in the closed cavity by applying a second voltage between the first transparent electrode and the second transparent electrode, so that the grating unit transmits the light incident from the direction of the first control layer away from the second control layer. The second voltage herein is zero, which indicates that the potentials on the first transparent electrode and the second transparent electrode are equal. Alternatively, when the charged particles are transparent particles, the charged particles are moved, by applying a voltage between the first transparent electrode and the second transparent electrode, to the inner surface of the second transparent electrode.

It should be noted that sequences of steps in the display method for the display device provided by the embodiment of the present disclosure may be appropriately adjusted, and the steps may also be correspondingly increased or decreased depending on circumstances. Any method that can be easily conceived by any skilled in the art within the technical scope disclosed in the present disclosure shall be contained within the protection scope of the present disclosure, and therefore is not described in detail here.

In summary, according to the display method for the display device provided by the embodiment of the present disclosure, when the display units in the target row in the display device are in the dark state, the multiple rows of display units in the dark state may be equivalent to the gratings arranged along the column arrangement direction of the display unit; and when the display units in the target column in the display device are in the dark state, the multiple columns of display units in the dark state may be equivalent to the gratings arranged along the row arrangement direction of the display unit. Thus, In the display device provided by the embodiment of the present disclosure, the gratings can be switched between lateral and longitudinal directions, which enables the display device to have a 3D display effect in different directions, and thereby improves flexibility of the 3D display.

Respective structures involved in the aforesaid method embodiments have been described in detail in the device embodiments, and is not be described in detail here.

The embodiment of the present disclosure provides a computer storage medium. When the computer program in the storage medium is executed by the processor, the display device display method as shown in FIG. 9 can be executed.

Persons of ordinary skill in the art can understand that all or part of the steps described in the above embodiments can be completed through hardware, or through relevant hardware instructed by applications stored in a non-transitory computer readable storage medium, such as a read-only memory, a dish or a CD, etc.

The term "and/or" in the embodiment of the present disclosure merely describes the association relationship between the associated objects and indicates that there may be three relationships; for example, A and/or B may indicate three cases where only A exists, A and B exist at the same time, and only B exists. The character "/" in the present disclosure generally indicates that the relationship between the former and later associated objects is "OR".

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display substrate, comprising: a light emitting substrate and a grating substrate comprising: a first base substrate and a plurality of grating units on the first base substrate,
    wherein each of the grating units comprises two control layers, a barrier structure between the two control layers, and a plurality of movable particles in a closed cavity surrounded by the barrier structure and the two control layers, wherein the two control layers comprise a first control layer and a second control layer, the first control layer being located on a side of the second control layer distal from the first base substrate, and the two control layers being configured to control movement of the particles;
    wherein the particles have a refractive index smaller than a refractive index of the first control layer, and the particles are non-transparent particles; and
    the first control layer in each of the grating units comprises a first transparent electrode and a reflective film that are stacked, the reflective film being located on a side of the first transparent electrode proximal to the first base substrate, the second control layer in each of the grating units comprises a second transparent electrode, the particles are charged particles, wherein the charged particles have a refractive index smaller than a refractive index of the reflective film, such that the particles in the closed cavity are moved to a surface of the reflective film proximal to the second control layer by applying a first voltage between the first transparent electrode and the second transparent electrode, to inhibit each of the grating units from transmitting light; and
    wherein the light emitting substrate comprises a second base substrate and a plurality of light emitting units on the second base substrate, the light emitting substrate and the grating substrate are oppositely arranged, and the light emitting units are arranged in one-to-one correspondence with the grating units in the grating substrate.

2. The display substrate according to claim 1, wherein each of the light emitting units comprises a third electrode, a light emitting layer, and a fourth transparent electrode that are stacked along a direction away from the second base substrate; and
    the fourth transparent electrode in each of the light emitting units is multiplexed with a first transparent electrode in a corresponding grating unit.

3. The display substrate according to claim 1, wherein each of the light emitting units comprises a third electrode, a light emitting layer, a fourth transparent electrode, and an insulating layer that are stacked along a direction away from the second base substrate; and
    the first transparent electrode in each of the grating units is located on a side of the insulating layer in a corresponding light emitting unit distal from the second base substrate.

4. The display substrate according to claim 1, further comprising a baffle structure between two adjacent light emitting units, wherein one end of the baffle structure is connected to the first base substrate in the grating substrate, and the other end of the baffle structure is connected to the second base substrate.

5. The display substrate according to claim 4, wherein the baffle structure is a non-light-transmitting structure.

6. The display substrate according to claim 1, wherein the display substrate is one of an organic light emitting diode display substrate and a quantum dot light emitting diode display substrate.

7. A display device, comprising a display substrate comprising: a light emitting substrate and a grating substrate comprising: a first base substrate and a plurality of grating units on the first base substrate,
    wherein each of the grating units comprises two control layers, a barrier structure between the two control layers, and a plurality of movable particles in a closed cavity surrounded by the barrier structure and the two control layers, wherein the two control layers comprise a first control layer and a second control layer, the first control layer being located on a side of the second control layer distal from the first base substrate, and the two control layers being configured to control movement of the particles;
    wherein the particles have a refractive index smaller than a refractive index of the first control layer, and the particles are non-transparent particles; and
    the first control layer comprises a first transparent electrode and a reflective film that are stacked, the reflective film being located on a side of the first transparent electrode proximal to the first base substrate, the second control layer comprises a second transparent electrode, the particles are charged particles, wherein the charged particles have a refractive index smaller than a refractive index of the reflective film, such that the particles in the closed cavity are moved to a surface of the reflective film proximal to the second control layer by applying a first voltage between the first transparent electrode and the second transparent electrode, to inhibit each of the grating units from transmitting light; and
    wherein the light emitting substrate comprises a second base substrate and a plurality of light emitting units on the second base substrate, the light emitting substrate and the grating substrate are oppositely arranged, and the light emitting units are arranged in one-to-one correspondence with the grating units in the grating substrate.

8. A display method for a display device, applied to the display device as defined in claim 7, the display device comprising a plurality of display units arranged in a matrix, and each of the display units comprising one of the light emitting units and one of the grating units which is stacked with the light emitting unit, the method comprising:

acquiring a three-dimensional display direction of the display device when the display device is configured to display a three-dimensional image;

performing, when the three-dimensional display direction is a row arrangement direction of the display units, a darkening operation on each of display units in a target column to enable each of the display units in the target column to be in a dark state; and performing, when the three-dimensional display direction is a column arrangement direction of the display units, the darkening operation on each of display units in a target row to enable each of the display units in the target row to be in the dark state;

wherein performing the darkening operation on a target display unit comprises:

moving, under a control action of a first control layer and a second control layer in a grating unit of the target display unit, a plurality of the particles in a closed cavity of the grating unit of the target display unit to a target surface, to inhibit the grating unit of the target display unit from transmitting light, wherein the target surface comprises an inner surface of the first control layer in the grating unit of the target display unit.

9. The method according to claim 8, wherein moving, under the control action of the first control layer and the second control layer in the grating unit of the target display unit, the particles in the closed cavity of the grating unit of the target display unit to the target surface, comprises:

moving, by applying a first voltage between the first transparent electrode and the second transparent electrode in the grating unit of the target display unit, the particles in the closed cavity of the grating unit of the target display unit to a surface of the first transparent electrode in the grating unit of the target display unit proximal to the second control layer in the grating unit of the target display unit.

10. The method according to claim 8, wherein moving, under the control action of the first control layer and the second control layer in the grating unit of the target display unit, the particles in the closed cavity of the grating unit of the target display unit to the target surface, comprises:

moving, by applying a first voltage between the first transparent electrode and the second transparent electrode in the grating unit of the target display unit, the particles in the closed cavity of the grating unit of the target display unit to a surface of the reflective film in the grating unit of the target display unit proximal to the second control layer in the grating unit of the target display unit.

11. The method according to claim 8, further comprising:

performing, when the display device is configured to display a two-dimensional image, a brightening operation on each of the display units, wherein performing the brightening operation on the target display unit comprises:

moving, under the control action of the first control layer and the second control layer in the grating unit of the target display unit, the particles in the closed cavity of the grating unit of the target display unit to be distal from the target surface, to enable the first control layer in the grating unit of the target display unit to transmit light emitted from the light emitting unit of the target display unit.

12. The display device according to claim 7, wherein each of the light emitting units comprises a third electrode, a light emitting layer, and a fourth transparent electrode that are stacked along a direction away from the second base substrate; and the fourth transparent electrode in each of the light emitting units is multiplexed with a first transparent electrode in a corresponding grating unit.

13. The display device according to claim 7, wherein each of the light emitting units comprises a third electrode, a light emitting layer, a fourth transparent electrode, and an insulating layer that are stacked along a direction away from the second base substrate; and the first transparent electrode in each of the grating units is located on a side of the insulating layer in a corresponding light emitting unit distal from the second base substrate.

14. The display device according to claim 7, further comprising a baffle structure between two adjacent light emitting units, wherein one end of the baffle structure is connected to the first base substrate in the grating substrate, and the other end of the baffle structure is connected to the second base substrate.

15. The display device according to claim 14, wherein the baffle structure is a non-light-transmitting structure.

16. The display device according to claim 7, wherein the display substrate is one of an organic light emitting diode display substrate and a quantum dot light emitting diode display substrate.

17. The display device according to claim 7, wherein each of the grating units further comprises a driving circuit configured to apply a voltage between the first transparent electrode and the second transparent electrode in the grating unit.

18. The display device according to claim 7, wherein in each of the grating units, a surface of the first control layer proximal to the second control layer is provided with a plurality of convex curved surfaces arranged in an array.

19. The display device according to claim 18, wherein the convex curved surface is one of a hemispherical surface and a semi-ellipsoidal surface.

20. The display device according to claim 7, wherein the particles are black ink particles.

* * * * *

UNITED STATES PATENT AND TRADEMARK OFFICE
CERTIFICATE OF CORRECTION

PATENT NO. : 11,774,776 B2
APPLICATION NO. : 16/956074
DATED : October 3, 2023
INVENTOR(S) : Wenchang Tao et al.

Page 1 of 1

It is certified that error appears in the above-identified patent and that said Letters Patent is hereby corrected as shown below:

On the Title Page

Item (73) should read: Fuzhou BOE Optoelectronics Technology Co., Ltd., Fujian (CN); BOE Technology Group Co., Ltd., Beijing (CN)

Signed and Sealed this
Twenty-first Day of November, 2023

Katherine Kelly Vidal
*Director of the United States Patent and Trademark Office*